(12) United States Patent
Tanabe et al.

(10) Patent No.: US 10,488,248 B2
(45) Date of Patent: Nov. 26, 2019

(54) OSCILLATION ANALYSIS PROGRAM AND DEVICE

(71) Applicant: HITACHI, LTD., Chiyoda-ku, Tokyo (JP)

(72) Inventors: Yosuke Tanabe, Tokyo (JP); Masanori Watanabe, Tokyo (JP); Naoki Yoneya, Tokyo (JP)

(73) Assignee: HITACHI, LTD., Tokyo (JP)

( * ) Notice: Subject to any disclaimer, the term of this patent is extended or adjusted under 35 U.S.C. 154(b) by 109 days.

(21) Appl. No.: 15/575,563

(22) PCT Filed: Apr. 27, 2016

(86) PCT No.: PCT/JP2016/063126
§ 371 (c)(1),
(2) Date: Nov. 20, 2017

(87) PCT Pub. No.: WO2016/190034
PCT Pub. Date: Dec. 1, 2016

(65) Prior Publication Data
US 2018/0128675 A1    May 10, 2018

(30) Foreign Application Priority Data

May 28, 2015   (JP) .................................. 2015-108069

(51) Int. Cl.
*G01H 17/00*   (2006.01)
*G06F 17/50*   (2006.01)

(52) U.S. Cl.
CPC ............. *G01H 17/00* (2013.01); *G06F 17/50* (2013.01); *G06F 17/5009* (2013.01)

(58) Field of Classification Search
CPC ...... G01H 17/00; G06F 17/50; G06F 17/5009
(Continued)

(56) References Cited

U.S. PATENT DOCUMENTS

| 8,321,189 B1 | 11/2012 | Ma et al. |
| 8,494,790 B2 * | 7/2013 | Zhu .......................... G01H 1/00 702/56 |
| 2015/0066398 A1 * | 3/2015 | Rhoe ....................... G06F 17/00 702/56 |

FOREIGN PATENT DOCUMENTS

| JP | H-09-091334 A | 4/1997 |
| JP | 2008-152623 A | 7/2008 |
| JP | 2008-224290 A | 9/2008 |

OTHER PUBLICATIONS

Nagamatsu, Akio, "Introduction to Mode Analysis," Corona Publishing Co., Ltd., Oct. 30, 2004, pp. 113-115.
(Continued)

*Primary Examiner* — John H Le
(74) *Attorney, Agent, or Firm* — Foley & Lardner LLP

(57) ABSTRACT

A problem of the present invention is to provide a vibration analysis program capable of analyzing bidirectional exchanges between a distribution amount and a difference amount with respect to an external system of the part in a part modeled as a finite element, in which the difference amount accumulation characteristic and the distribution amount accumulation characteristic are distributed. A vibration analysis program of the present invention includes a first step 6 of importing a finite element model of a target part modeled by a finite element method program 4 to calculate an accumulation characteristic matrix and connection matrix, a second step 8 of calculating a difference amount-distribution amount mode matrix and eigenvectors after inputting 7 an attenuation characteristic to the accumulation characteristic matrix or the connection matrix as necessary, and a third step 14 of importing an input difference amount-flow amount vector to a target part obtained from an external system simulator 9, performing a mode coordinate transformation of the input difference amount-
(Continued)

flow amount vector, calculating the mode vector response, and performing physical coordinate transformation of mode vector.

4 Claims, 8 Drawing Sheets

(58) Field of Classification Search
USPC .................................................. 702/56; 703/7
See application file for complete search history.

(56) References Cited

OTHER PUBLICATIONS

International Search Report with English Translation and Written Opinion issued in corresponding application No. PCT/JP2016/063126 dated Jul. 19, 2016.

\* cited by examiner $m = 1\text{kg}$
$k = 3 \text{ N/m}$

US 10,488,248 B2

OSCILLATION ANALYSIS PROGRAM AND DEVICE

TECHNICAL FIELD

The present invention relates to a vibration analysis program and a vibration analysis device using the same.

BACKGROUND ART

In recent years, products that perform work across various fields such as electrical, mechanical, and fluid systems are increasing. In such a product, a coordinate system taken by individual component parts and a basic state quantity representing the state of a system vary according to the field. Therefore, when simulating product performance and functions, a simulator formulated from the viewpoint of energy independent of the coordinate system is used (For example, PTL 1).

CITATION LIST

Patent Literature

PTL 1: JP 2008-152623 A

Non-Patent Literature

NPL 1: Akio Nagamatsu, "Introduction to Mode Analysis", CORONA PUBLISHING CO., LTD., published on Oct. 30, 2004, pages 113 to 115

SUMMARY OF INVENTION

Technical Problem

In the simulator disclosed in PTL 1, in order to analyze the energy balance of the entire product, as the basic state quantity representing the state of a system, a distribution amount such as current and force and a difference amount such as voltage and speed are adopted. Then, by analyzing the exchange of the two basic state quantities among the component parts of the product, the energy balance of the whole product is analyzed. Here, the physical characteristics of the component parts can be modeled by combining the physical characteristic value of a lumped constant, for example, a distribution amount accumulation characteristics such as elasticity and inductance, a difference amount accumulation characteristic such as mass and conductance, and the loss characteristic.

However, depending on the component parts, accumulation characteristics and loss characteristics are distributed throughout the parts, and some parts are difficult to model as lumped constant characteristics. With respect to such a component part, firstly, there is a method of modeling the component part with a finite element, transforming the modeled component part into a finite-order mode model by a mode analysis method disclosed in Non-PTL 1, and incorporating the conversion result into a simulator disclosed in PTL 1.

For example, if a finite element method is used for a part having accumulation characteristics distributed, the component part can be modeled as shown in FIG. 7 as a form in which the difference amount accumulation characteristic and the distribution amount accumulation characteristic are connected. In FIG. 7, a part 1 is modeled in such a manner that a mass point 2 as the difference amount accumulation characteristic and a spring 3 as the distribution amount accumulation characteristic are connected. In the case of this example, the difference amount is a speed and the distribution amount is force.

In the finite element method, the response of the difference amount when a distribution amount vector is input from an external system to the part shown in FIG. 7 is expressed by the following equation.

[Equation 1]

$$[M]\{\dot{v}\}+\int[K_C]\{v\}dt=\{F_{ext}\} \quad \text{[Equation 1]}$$

Here, [M] is a difference amount accumulation characteristic matrix, $[K_C]$ is a distribution amount accumulation characteristic concatenation matrix, $\{v\}$ is difference amount vector, t is time, and $\{F_{ext}\}$ is an input distribution amount vector input to the part from the external system.

Furthermore, according to the mode analysis method disclosed in Non-PTL 1, the difference amount vector is expressed by the following equation.

[Equation 2]

$$\{v\}=[\Phi]\{q\} \quad (2)$$

Here, $[\Phi]$ is a mode matrix including N mutually independent vector groups, and $\{q\}$ is a difference amount vector on mode coordinates.

By substituting equation (2) into equation (1) and multiplying a transposed mode matrix from the left side of each side, the following equation is obtained.

[Equation 3]

$$[\Phi]^T[M][\Phi]\{\dot{q}\}+[\Phi]^T[K_C][\Phi]\int\{q\}dt=[\Phi]^T\{F_{ext}\} \quad (3)$$

Here, a superscript T on a right shoulder indicates transposition of the matrix.

In [3], since $[\Phi]^T[M][\Phi]$ and $[\Phi]^T[KC][\Phi]$ are diagonalized, motion equation of mass point-spring system with N degree order of one degree of freedom is obtained. Therefore, when $[\Phi]^T$ is regarded as a coordinate conversion coefficient from physical coordinate to mode coordinate, equation (3) is considered to be a process of calculating the response of the difference amount vector on the mode coordinate in response to the input distribution amount from the external system. Furthermore, by substituting the response result into equation (2) and converting from mode coordinate to physical coordinate, it is possible to obtain the difference amount input from the part to the external system.

However, in the conventional method described above, since the difference amount is used as the basic state quantity of the part, it is only possible to input the distribution amount from the external system and output the difference amount. Therefore, for example, there is a problem that it is difficult to perform analysis obtained by inputting the difference amount from the external system and outputting the distribution amount, and as a result, it is difficult to analyze the energy balance of the whole product by exchanging the analysis result with the simulator or the like disclosed in PTL 1.

The present invention has been made in view of the above technical problem, and it is an object of the present invention to provide a vibration analysis program and device capable of analyzing bidirectional exchanges between a flow amount and a difference amount with respect to an external system of the part in a part modeled as a finite element, in which the difference amount accumulation characteristic and the flow amount accumulation characteristic are distributed.

Solution to Problem

In order to achieve the above object, for example, the present invention provides a vibration analysis program that performs vibration analysis of a part constituted by a distribution of a difference amount accumulation characteristic of accumulating a difference amount by receiving a distribution amount and a distribution amount accumulation characteristic of accumulating a distribution amount by receiving a difference amount, the vibration analysis program including: a first step of converting the part into a accumulation characteristic matrix including a distribution amount accumulation characteristic and a difference amount accumulation characteristic and a connection matrix representing a connection relationship between the accumulation characteristics based on a finite element method model result for the part; a second step of converting the accumulation characteristic matrix and the connection matrix into a difference amount-distribution amount mode matrix and an eigenvalue vector; and a third step of subjecting an input difference amount-distribution amount vector input from an external system of the part to a mode coordinate transformation by using the difference amount-distribution amount mode matrix, calculating a mode vector response of time or frequency domain with respect to the input difference amount-distribution amount vector subjected to the mode coordinate transformation, and obtaining an output difference amount-distribution amount vector by subjecting the mode vector response to physical coordinate transformation using the difference amount-distribution amount mode matrix.

Further, in the vibration analysis program of the present invention, in the vibration analysis program described above, the vibration power mode inside the part is specified by using the difference amount-distribution amount mode matrix and the connection matrix.

Further, in the vibration analysis program of the present invention, for example, in the vibration analysis program described above, the input difference amount-flow amount vector is obtained by importing an output result of a simulator of an external system, and an energy balance between the external system and the part is analyzed by inputting the output difference amount-distribution amount vector to the simulator, and repeatedly performing calculation.

Advantageous Effects of Invention

The present invention provides a vibration analysis program and device capable of analyzing bidirectional exchanges between a flow amount and a difference amount with respect to an outside of the part in a part modeled as a finite element, in which the difference amount accumulation characteristic and the distribution amount accumulation characteristic are distributed.

DESCRIPTION OF EMBODIMENTS

Figure 1:
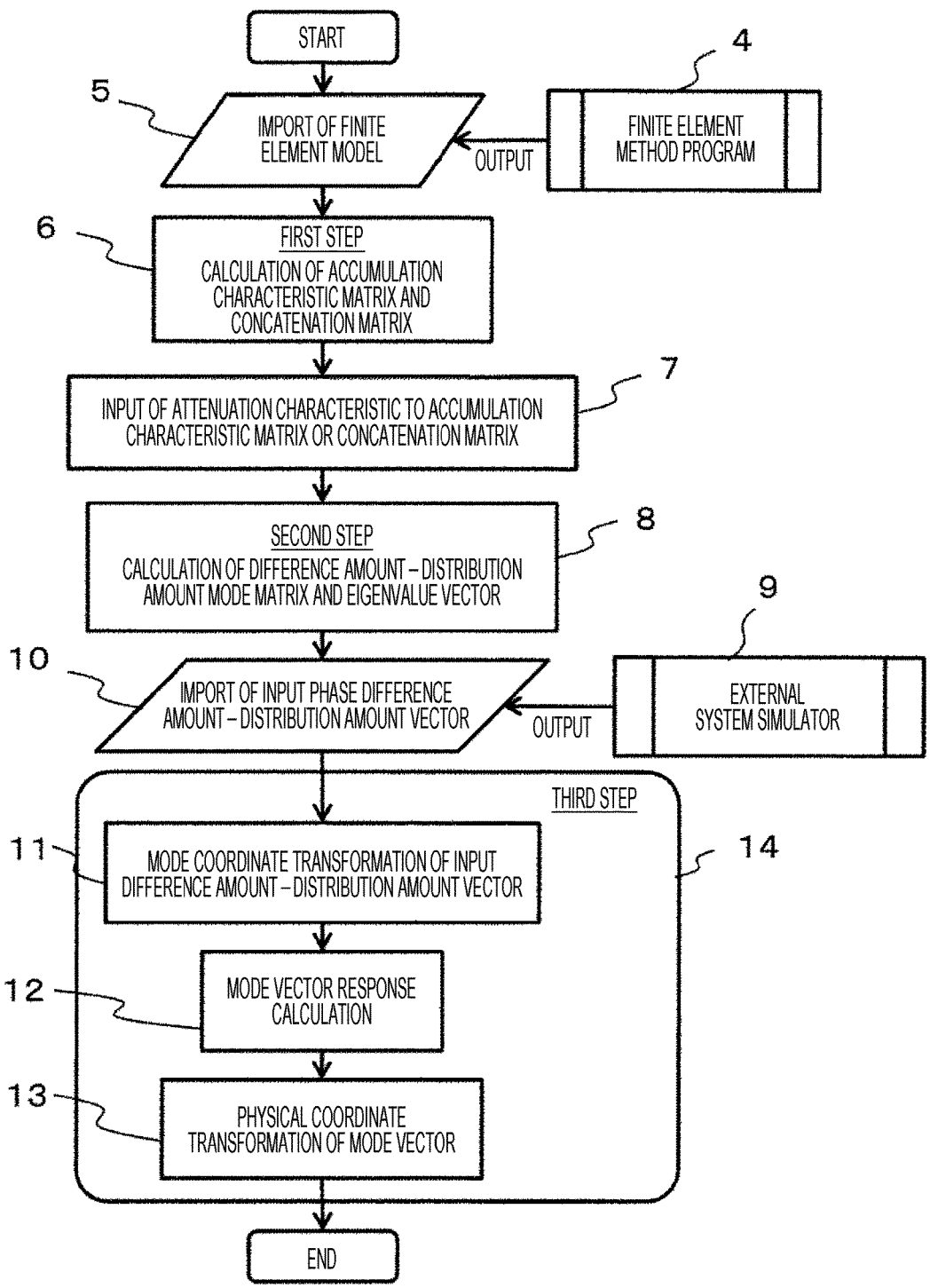
FIG. 1 is a flowchart showing a method of implementing a vibration analysis program of a first embodiment.

Hereinafter, an embodiment of a vibration analysis device according to the present invention will be described with reference to the drawings. In the first to third embodiments described below, an example of a vibration analysis program as a method of concretely analyzing vibration in the vibration analysis device according to the present invention will be described. In each drawing, the same reference numerals are given to the same elements, and redundant explanations are omitted.

First Embodiment

FIG. 1 is a flowchart showing a method of implementing the vibration analysis program according to the first embodiment. The vibration analysis program of the present embodiment mainly includes first to third steps described below.

The parts to be subjected to a vibration analysis are modeled by a finite element method program 4. The modeled finite element model is imported and in a first step 6, an accumulation characteristic matrix of the distribution amount and the difference amount, and a concatenation matrix representing a connection relationship between a distribution amount accumulation characteristic and a difference amount accumulation characteristic are calculated.

If necessary, an attenuation characteristic is input to the accumulation characteristic matrix or the concatenation matrix. Then, in a second step 8, a difference amount-distribution amount mode matrix and eigenvectors are calculated.

In the third step 14, first, the input difference amount-flow amount vector is subjected to mode coordinate transformation by using the difference amount-distribution amount mode matrix calculated in the second step 8. The input difference amount-flow amount vector is imported from an external system simulator 9. Subsequently, a mode vector response in the time or frequency domain with respect to the input difference amount-flow amount vector subjected to the mode coordinate transformation is calculated. Then, the mode vector response is subjected to physical coordinate transformation to obtain a vector of an output difference amount and the distribution amount.

Figure 8:
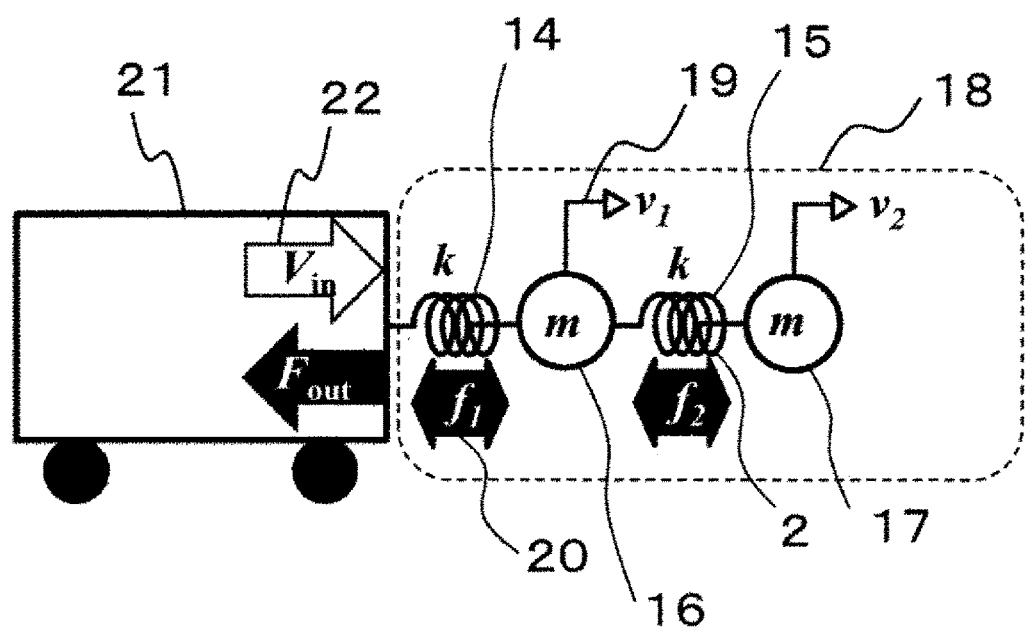
FIG. 8 is an analysis target for showing an example of a vibration analysis program.

The flowchart of the vibration analysis program shown in FIG. 1 will be described in more detail. In the following description, a part to be subjected to vibration analysis will be described by taking a part 18 as shown in FIG. 8 as an example. Consider a finite element model including two springs 14, 15 (spring constant k=3 [N/m]) and mass points 16 and 17 (mass m=1 [kg]) of the part 18. The part 18 responds by receiving an input speed 22 from an external system 21. The motion of such part 18 is expressed by the following equation in the form without external force.

[Equation 4]

$$\begin{bmatrix} m & 0 \\ 0 & m \end{bmatrix} \begin{Bmatrix} \dot{v}_1 \\ \dot{v}_2 \end{Bmatrix} + \begin{bmatrix} 2k & -k \\ -k & 2k \end{bmatrix} \int \begin{Bmatrix} v_1 \\ v_2 \end{Bmatrix} dt = 0 \qquad (4)$$

Here, m is the mass of the difference amount accumulation characteristic, k is the spring constant of the distribution amount accumulation characteristic, and $v_1$ and $v_2$ represent a speed 19 which is a difference amount at which the mass point 16 and the mass point 17 accumulate.

The first step 6 in the vibration analysis program of this embodiment will be described. In the first step 6, in addition to the speed 19 which is the difference amount, the force 20 which is the distribution amount accumulated by the springs 14, 15 is added to a basic state quantity and the equation (4) is transformed as follows.

[Equation 5]

$$\begin{bmatrix} m & 0 & 0 & 0 \\ 0 & m & 0 & 0 \\ 0 & 0 & 1/k & 0 \\ 0 & 0 & 0 & 1/k \end{bmatrix} \begin{Bmatrix} \dot{v}_1 \\ \dot{v}_2 \\ \dot{f}_1 \\ \dot{f}_2 \end{Bmatrix} + \begin{bmatrix} 0 & 0 & -1 & 1 \\ 0 & 0 & 0 & -1 \\ 1 & 0 & 0 & 0 \\ -1 & 1 & 0 & 0 \end{bmatrix} \begin{Bmatrix} v_1 \\ v_2 \\ f_1 \\ f_2 \end{Bmatrix} = \begin{Bmatrix} 0 \\ 0 \\ V_{in} \\ 0 \end{Bmatrix} \quad (5)$$

Here, the matrix of a first term on a left side is called an accumulation characteristic matrix, and the matrix of a second term on the left side is called a concatenation matrix. Also, $V_{in}$ is an input speed 22 which is a difference amount from the external system 21. In the present embodiment, although only the difference amount is input, as is apparent from the equation (5), the difference amount and the distribution amount can be input for an arbitrary storage characteristic.

Next, the second step 8 in the vibration analysis program of this embodiment will be described. In the second step 8, the following equation (6) is obtained from the accumulation characteristic matrix of equation (5) and the concatenation matrix.

[Equation 6]

$$\begin{bmatrix} 1 & 0 & 0 & 0 \\ 0 & 1 & 0 & 0 \\ 0 & 0 & 1 & 0 \\ 0 & 0 & 0 & 1 \end{bmatrix} \begin{Bmatrix} \dot{v}_1 \\ \dot{v}_2 \\ \dot{f}_1 \\ \dot{f}_2 \end{Bmatrix} = \begin{bmatrix} 0 & 0 & 1/m & -1/m \\ 0 & 0 & 0 & 1/m \\ -k & 0 & 0 & 0 \\ k & -k & 0 & 0 \end{bmatrix} \begin{Bmatrix} v_1 \\ v_2 \\ f_1 \\ f_2 \end{Bmatrix} \quad (6)$$

Further, eigenvalue analysis of equation (6) is performed to obtain eigenvalue vector expressed by the following equation.

[Equation 7]

$$j\omega_0 \begin{Bmatrix} \phi - 1 \\ 1 - \phi \\ \phi \\ -\phi \end{Bmatrix} \quad (7)$$

Here, j is a complex number, $\omega_0 = \sqrt{(k/m)}$ is an angular frequency, $\varphi = (1+\sqrt{5})/2 = 1.618 \ldots$ is a golden number.

Also, the eigenvector matrix is as follows.

[Equation 8]

$$[\Psi] = \begin{bmatrix} d_1 \begin{Bmatrix} 1 \\ \phi \\ j\omega_0\phi \\ j\omega_0 \end{Bmatrix} & d_1 \begin{Bmatrix} 1 \\ \phi \\ -j\omega_0\phi \\ -j\omega_0 \end{Bmatrix} & d_2 \begin{Bmatrix} 1 \\ 1-\phi \\ j\omega_0(\phi-1) \\ j\omega_0 \end{Bmatrix} & d_2 \begin{Bmatrix} 1 \\ 1-\phi \\ j\omega_0(1-\phi) \\ -j\omega_0 \end{Bmatrix} \end{bmatrix} \quad (8)$$

Here, $[\Psi]$ is the amount-of-displacement mode matrix, and $d_1$ and $d_2$ are accumulation characteristic normalization coefficients, which are expressed by the following equation.

[Equation 9]

$$d_1 = \frac{1}{\sqrt{\left(m + \frac{\omega_0^2}{k}\right)(\phi^2 + 1)}} \quad d_2 = \frac{1}{\sqrt{\left(m + \frac{\omega_0^2}{k}\right)((1-\phi)^2 + 1)}} \quad (9)$$

Therefore, the difference amount and the distribution amount in the physical coordinate can be expressed by the following equation using the difference amount-distribution amount mode matrix of equation (8) and the mode vector $\{q\}$ in mode coordinate.

[Equation 10]

$$\begin{Bmatrix} v_1 \\ v_2 \\ f_1 \\ f_2 \end{Bmatrix} = [\Psi] \begin{Bmatrix} q_1 \\ q_2 \\ q_3 \\ q_4 \end{Bmatrix} \quad (10)$$

Next, the third step 14 in the vibration analysis program of this embodiment will be described. In the third step 14, first, the difference amount and the distribution amount in the physical coordinate represented by the equation (10) are substituted into the equation (5) calculated in the first step 6. Then, the conjugate transposed matrix of the eigenvector matrix $[\Psi]$ of equation (8) is multiplied from the left of both sides to obtain the following equation (11).

[Equation 11]

$$[I]_4 \begin{Bmatrix} \dot{q}_1 \\ \dot{q}_2 \\ \dot{q}_3 \\ \dot{q}_4 \end{Bmatrix} + j\omega_0 \begin{bmatrix} 1-\phi & 0 & 0 & 0 \\ 0 & \phi-1 & 0 & 0 \\ 0 & 0 & -\phi & 0 \\ 0 & 0 & 0 & \phi \end{bmatrix} \begin{Bmatrix} q_1 \\ q_2 \\ q_3 \\ q_4 \end{Bmatrix} = V_{in} \begin{Bmatrix} -jd_1\phi/\omega_0 \\ jd_1\phi/\omega_0 \\ -jd_2(\phi-1)/\omega_0 \\ jd_2(\phi-1)/\omega_0 \end{Bmatrix} \quad (11)$$

Here, $[I]_4$ represents a four-dimensional identity matrix. The response calculation of the mode vector $\{q\}$ is performed using equation (11). Then, by performing the physical coordinate transformation of the mode vector $\{q\}$ by the equation (8), the response of a difference amount and a distribution amount in physical coordinate is obtained.

Figure 2:
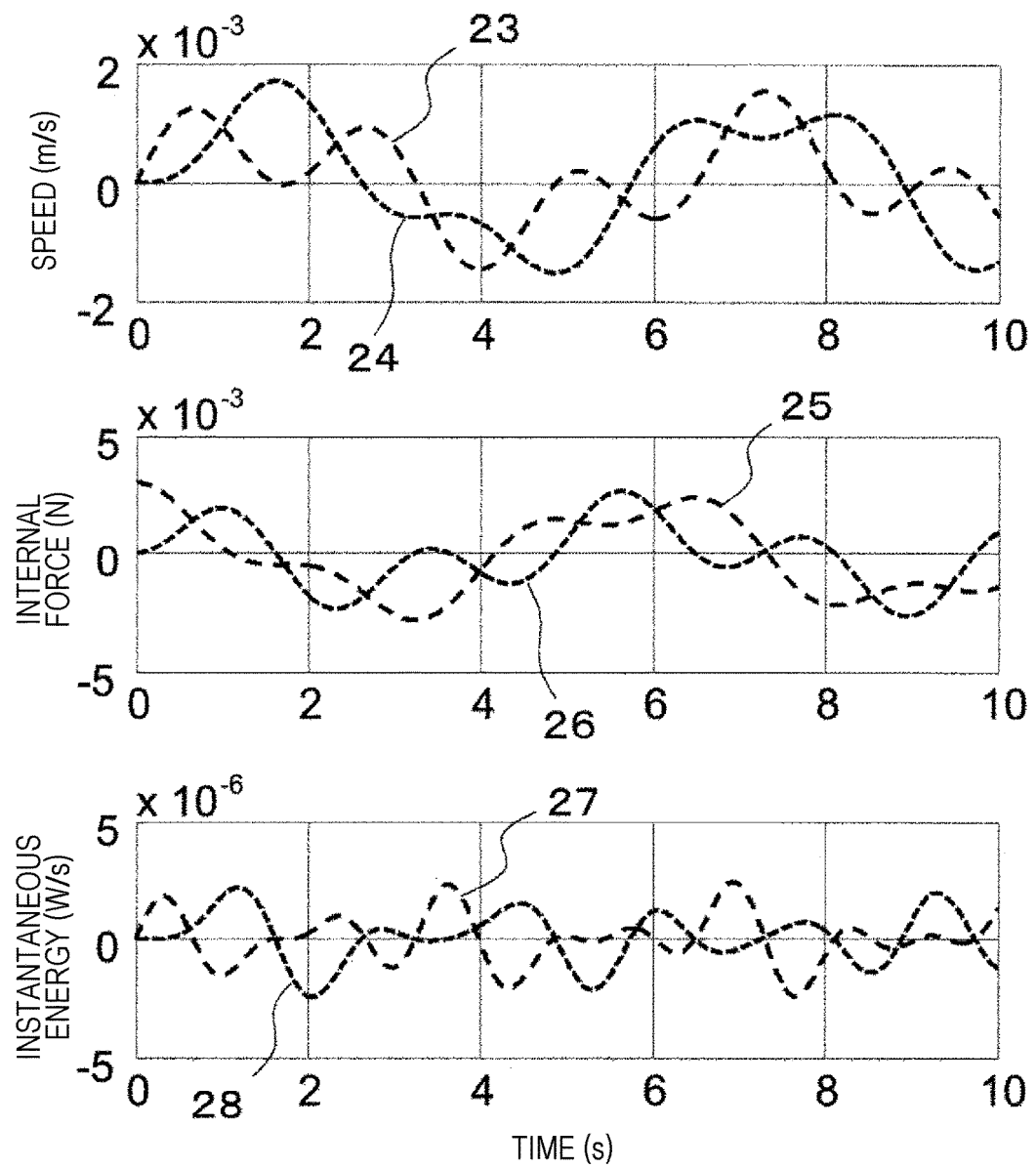
FIG. 2 is an output example in analyzing an analysis target in FIG. 8 in the first embodiment.

The calculation result of the response of the difference amount and the distribution amount in the physical coordinate thus obtained is shown in FIG. 2. The upper part of FIG. 2 shows a speed 23 accumulated at the mass point 16 and a speed 24 accumulated at the mass point 17 when inputting a unit speed as the input speed 22. The middle part of FIG. 2 is force 25 accumulated in the spring 14 and force 26 accumulated in the spring 15. In the lower part of FIG. 2, an instantaneous energy 27 flowing into the mass point 16 and an instantaneous energy 28 flowing into the mass point 17 are shown.

At the time 0 s, the force 25 is initially accumulated in the spring 14 by the input speed 22 from the external system 21. As time passes, the force 25 decreases while the speeds 23, 24 accumulated at the mass points 16, 17 and the force 26 accumulated in the spring 15 increase. This is because the accumulated energy of the spring 14 is distributed and coupled vibration occurs.

Looking at the instantaneous energies 27, 28 flowing into the mass points 16, 17, it is possible to analyze the state of coupled vibration in detail. It is the mass point 16 corresponding to the instantaneous energy 27 that first receives the energy of the spring 14. As described above, the vibration analysis program of the present embodiment is characterized in that it is possible to simultaneously analyze a difference amount between the difference amount accumulation characteristic and the distribution amount accumulation characteristic constituting the part 18 and the response of the distribution amount.

Second Embodiment

Figure 3:
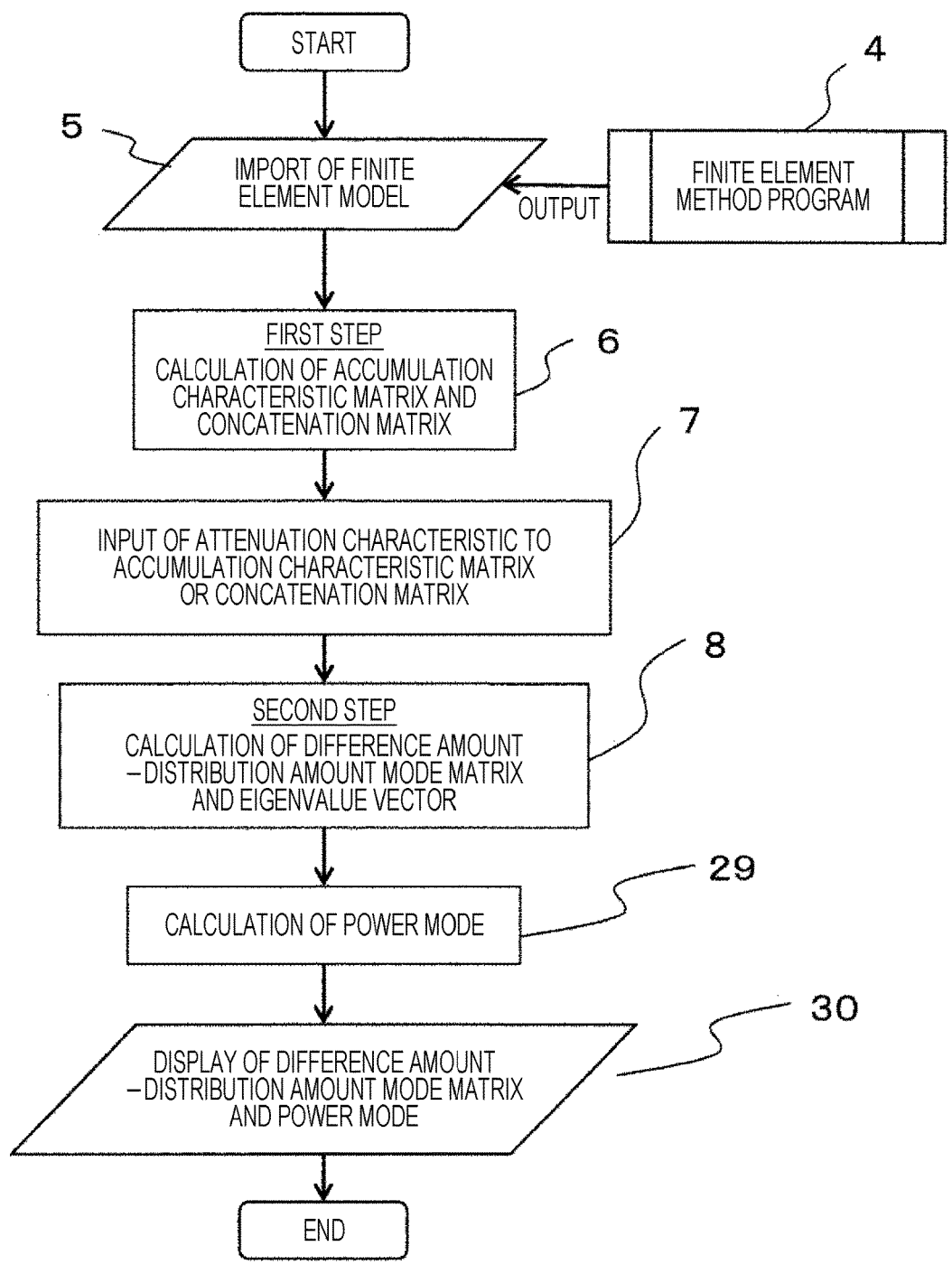
FIG. 3 is a flowchart showing a method of implementing a vibration analysis program of a second embodiment.

FIG. 3 is a flowchart showing a method of implementing the vibration analysis program according to the second embodiment. The vibration program of the present embodiment is characterized in that after the second step 8 in the vibration analysis program of the first embodiment, a step of specifying the vibration power mode inside the part is provided.

As explained in the first embodiment, in the vibration analysis program, in the second step 8, the difference amount-distribution amount mode matrix given by equation (8) is obtained. In this matrix, each column represents the mode shape of mass points 16, 17 and springs 14, 15 corresponding to eigenvalues of equation (7). For example, the mode shape corresponding to the first eigenvalue is expressed as shown in FIG. 4 from the mode vector of the first column of equation (8).

Figure 4:
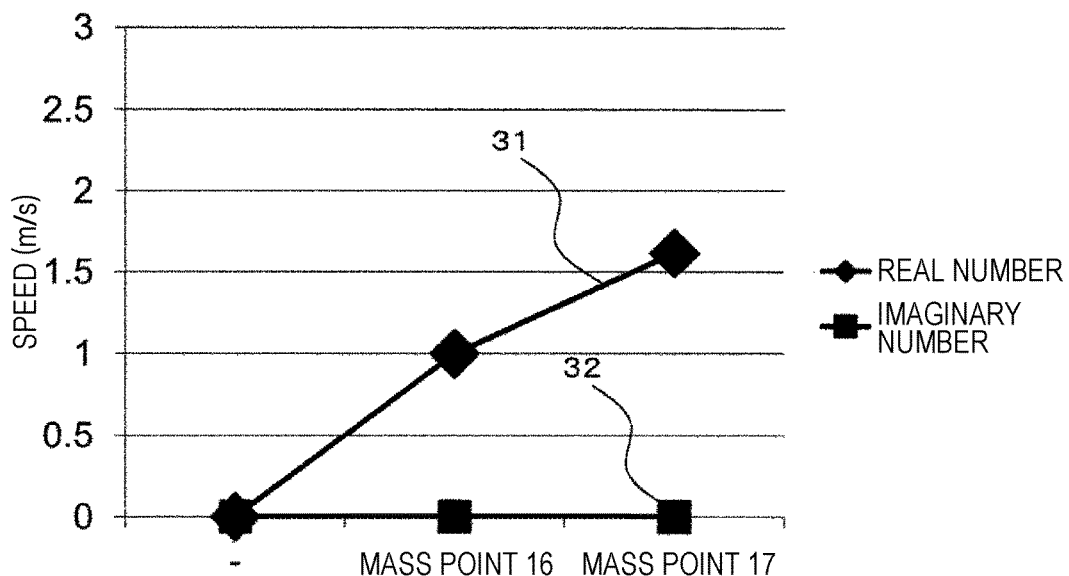
FIG. 4 is an output example in analyzing the analysis target in FIG. 8 in the second embodiment.
Figure 4:
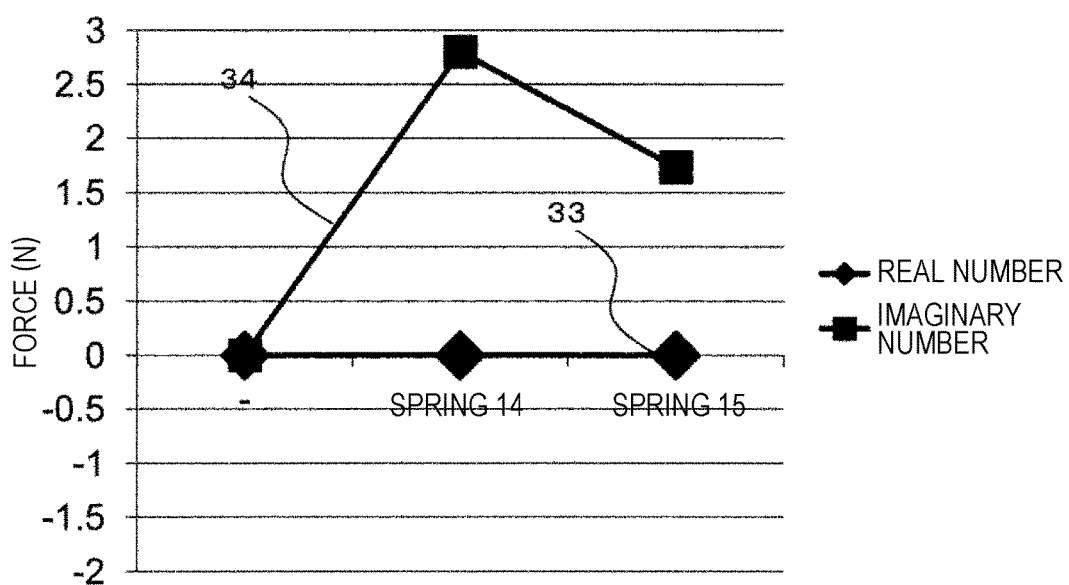

The upper part of FIG. 4 shows a real part 31 and an imaginary part 32 of the difference amount mode shape (unit is speed) of the mass points 16 and 17. The lower part of FIG. 4 shows a real part 33 and an imaginary part 34 of the distribution amount mode shape (unit is force) of the springs 14, 15. As described above, since the difference amount-distribution amount mode matrix [Ψ] is a complex number, it is necessary to express the mode shape by a real number and an imaginary number. From FIG. 4, the speed in the difference amount mode is a real number, but the force in the distribution amount mode is an imaginary number. That is, it can be seen that the distribution amount mode is advanced by 90 degrees in phase with respect to the difference amount mode. Therefore, when the difference amount of the mass points 16, 17 becomes maximum, the distribution amount of the springs 14, 15 becomes zero.

Further, a power mode indicating power flowing into each element is expressed as follows using the concatenation matrix of a second term on a left side of equation (5) and a difference flow-distribution amount mode matrix [Ψ] of equation (8).

[Equation 12]

$$[P] = [\overline{\Psi}] \circ \begin{bmatrix} 0 & 0 & -1 & 1 \\ 0 & 0 & 0 & -1 \\ 1 & 0 & 0 & 0 \\ -1 & 1 & 0 & 0 \end{bmatrix} [\Psi] \quad (12)$$

Here, [P] is the power mode matrix, an matrix operator "−" is an operation to take the conjugate of the component, and an operator "O" is the Hadamard product of the matrix.

As described above, the vibration analysis program of the present embodiment has the feature that the power mode in the internal elements of the component can be calculated for each eigenvalue and can be displayed as necessary.

Third Embodiment

Figure 5:
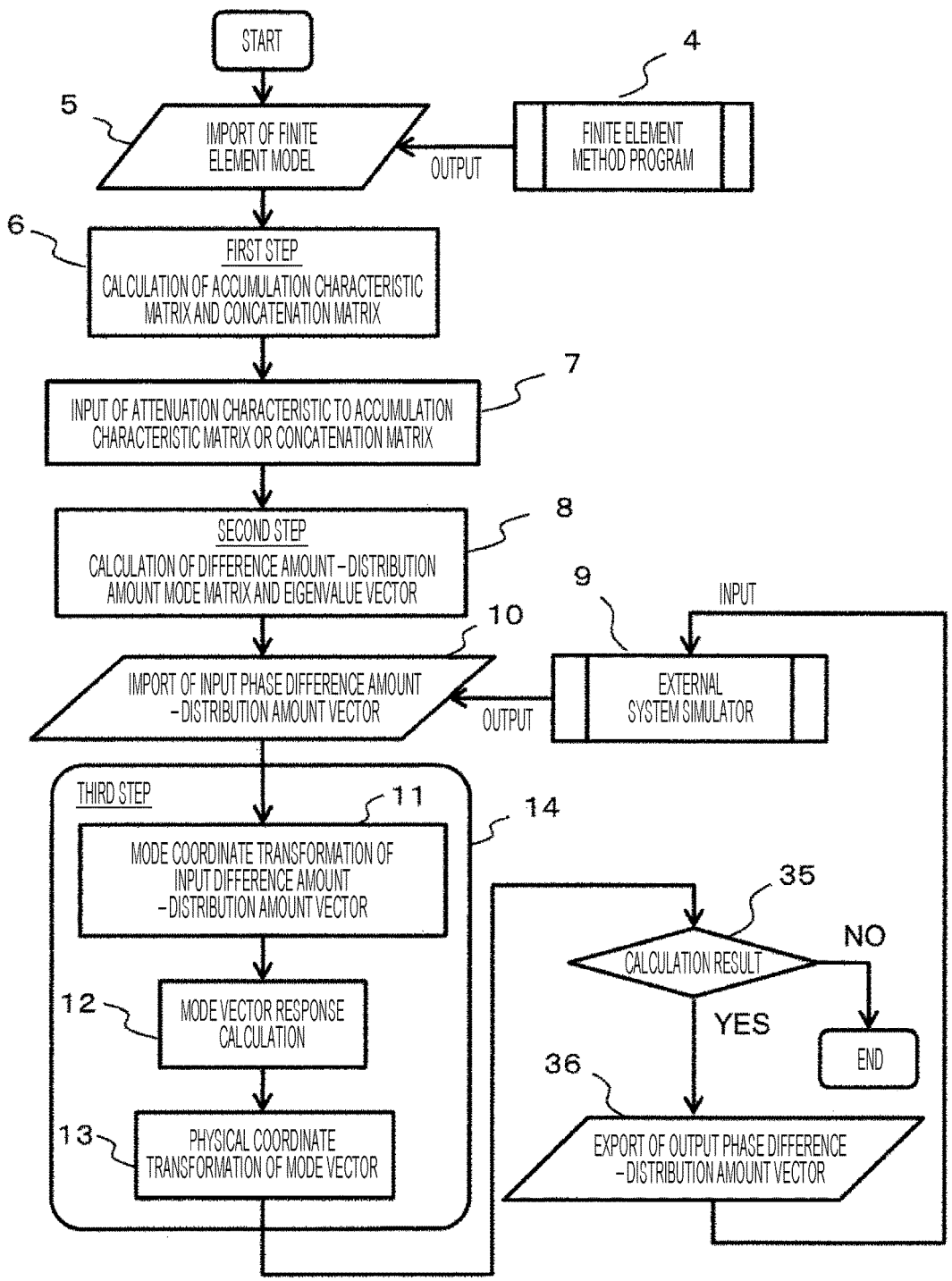
FIG. 5 is a flowchart showing a method of implementing a vibration analysis program of a third embodiment.

FIG. 5 is a flowchart showing a method of implementing the vibration analysis program according to the third embodiment. The vibration program of the present embodiment is characterized in that after the third step 14 in the vibration analysis program of the first embodiment, a step of analyzing an energy balance balance between the external system and the part is provided.

As shown in FIG. 5, the vibration analysis program of the present embodiment includes, after the third step 14, a loop calculation 35 for exporting the output difference amount-distribution amount vector and inputting the output difference amount-distribution amount vector as an input to the simulator 9 of the external system.

As an example, consider a case where a mass point 0.3 [kg] having a speed of 0.3 [m/s] collides with the part 18 shown in FIG. 8 as the external system 21. In this case, first, a vector on the right side of the equation (5) is obtained as a result of an import 10 of the input difference amount-distribution amount vector in FIG. 5.

Next, in the third step 14, for the mode vector obtained by solving the equation (11), the output difference amount-distribution amount vector in the physical coordinate is obtained by using the equation (10). Further, the output position difference amount-distribution amount vector which is input to the external system is exported, and is input to the external system simulator 9, and the loop calculation 35 is performed. With such a calculation procedure, it is possible to calculate the response of the whole system and the energy balance.

Figure 6:
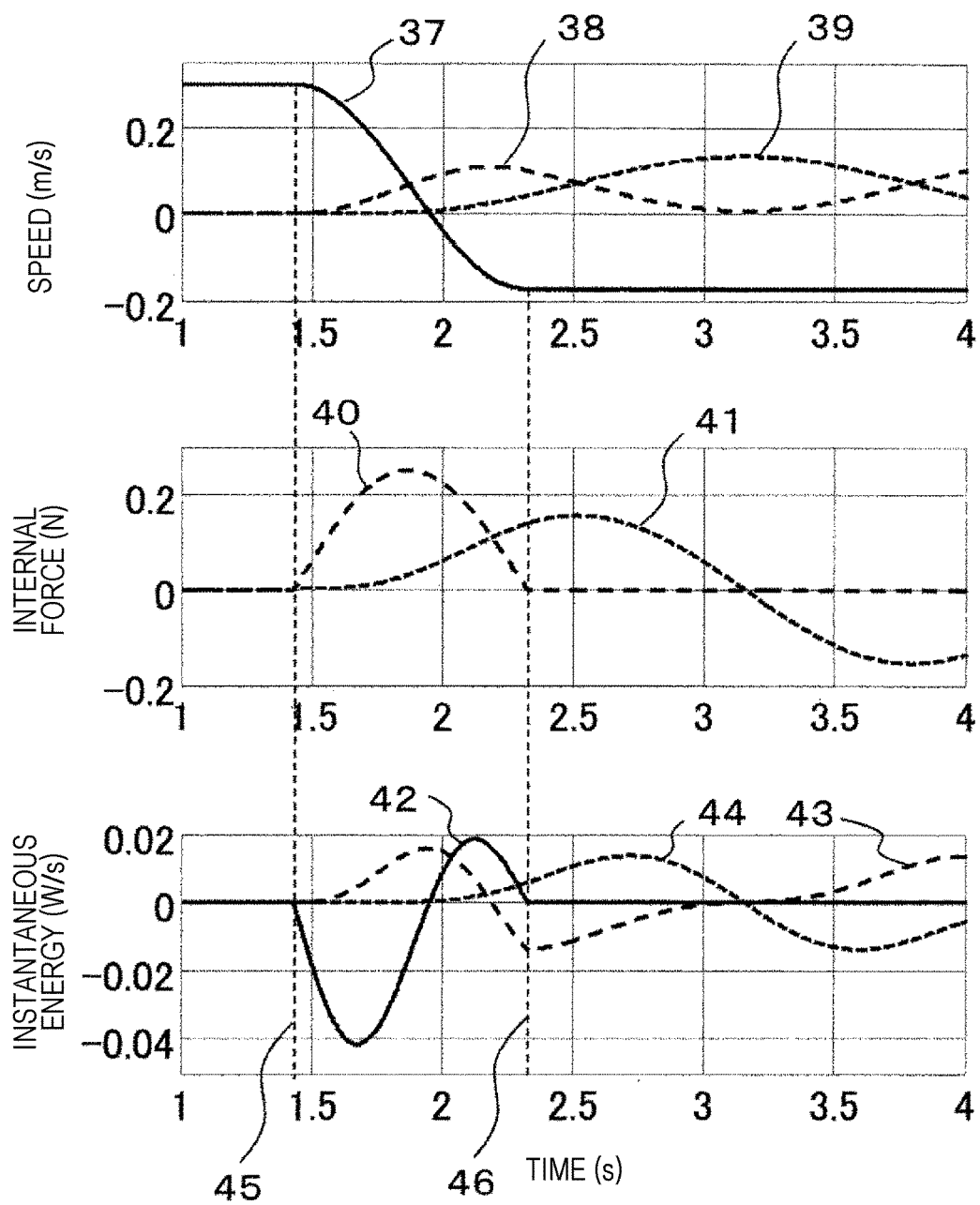
FIG. 6 is an output example in analyzing an analysis target in FIG. 8 in the third embodiment.
Figure 7:
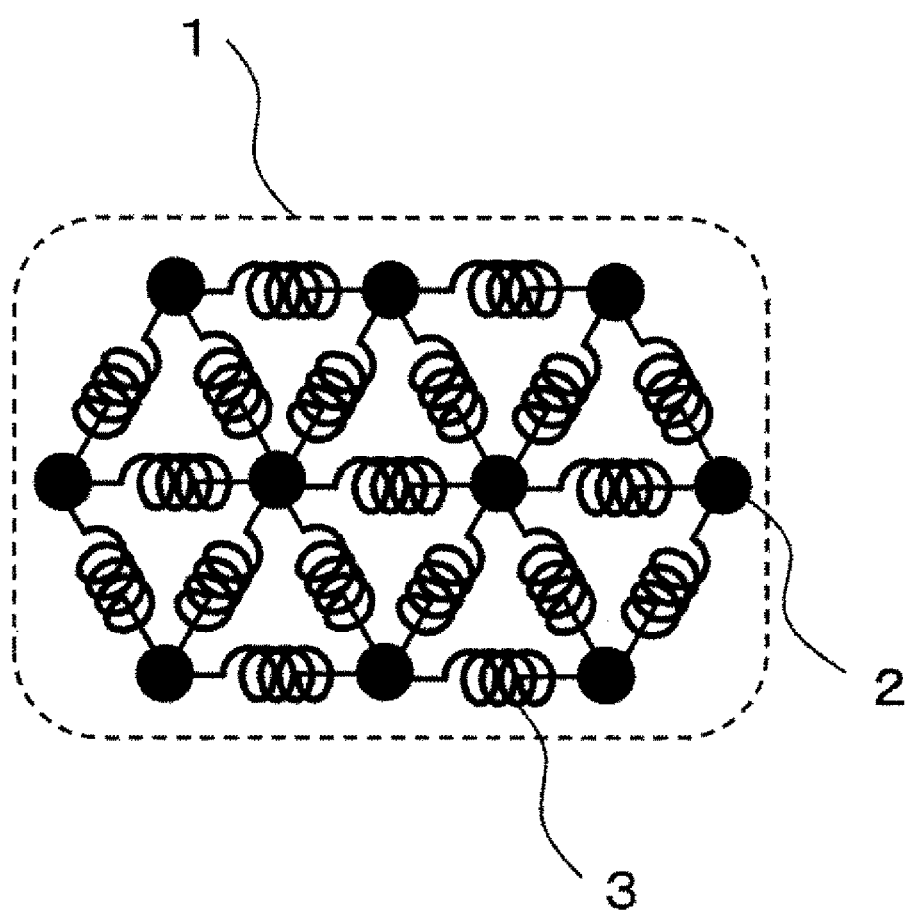
FIG. 7 is a model in which a mass point 2 (difference amount accumulation characteristic) and a spring 3 (distribution amount accumulation characteristic) are connected.

FIG. 6 shows the calculation result of the response of the difference amount and the distribution amount in physical coordinate when the external system 21 having a mass point of 0.3 [kg] having a speed of 0.3 [m/s] collides with the part 18. The upper part of FIG. 6 shows a speed 37 in the external system 21, a speed 38 in the mass point 16, and a speed 39 in the mass point 17. The middle part of FIG. 6 shows force 40 in the spring 14 and force 41 in the spring 15. The lower part of FIG. 6 shows the instantaneous energy 42 in the external system 21, the instantaneous energy 43 in the mass point 16, and the instantaneous energy 44 in the mass point 17.

From FIG. 6, immediately after a time 45 when the external system 21 collided with the part 18, the speed 37 of the external system 21 decreases while the force 40 of the spring 14 increases. Also, the instantaneous energy 42 of the external system 21 is negative, which is spent to reduce the kinetic energy accumulated in the external system 21. The instantaneous energy becomes positive from the middle, because part of the force energy accumulated in the spring 14 flows into the external system 21. This can be confirmed since the speed 37 of the external system 21 becomes negative from zero. At instant 46 when the force 40 of the spring 14 is zero, that is, the external system 21 and the spring 14 are disconnected, the instantaneous energy 42 input to the external system 21 becomes zero. From this point onward, the external system 21 maintains the motion while keeping the speed 37, as the kinetic energy of the mass points 16 and 17 and the force energy of the spring 15, the lost kinetic energy exchanges these energies and performs coupled vibration. As described above, the vibration analyzing program and the vibration analyzing apparatus of the present embodiment have the feature of being able to analyze the energy balance with the external system.

REFERENCE SIGNS LIST 1 part modeled as finite element
2 mass point (difference amount accumulation characteristic)
3 spring (distribution amount accumulation characteristic)
4 finite element method program
5 import of finite element model
6 calculation of accumulation characteristic matrix, and concatenation matrix
7 input of attenuation characteristic to accumulation characteristic matrix or concatenation matrix
8 calculation of difference amount-distribution amount mode matrix and eigenvalue vector
9 external system simulator
10 import of input difference amount-distribution amount vector
11 mode coordinate transformation of input difference amount-distribution amount vector
12 mode vector response calculation
13 physical coordinate transformation of mode vector
14 first spring
15 second spring
16 first mass point
17 second mass point
18 two degree of freedom system part
19 speed
20 force
21 external system
22 input speed from external system
23 accumulation speed of mass point 16
24 accumulation speed of mass point 17
25 force accumulated by spring 14
26 force accumulated by spring 15
27 instantaneous energy input to mass point 16
28 instantaneous energy input to mass point 17
29 calculation of power mode
30 calculation of difference amount-distribution amount mode and power mode
31 real part of difference amount mode shape of mass point 16
32 imaginary part of difference amount mode shape of mass point 17
33 real part of distribution amount mode shape of spring 14
34 imaginary part of distribution amount mode shape of spring 15
35 calculation continuation
36 export of output difference amount-distribution amount vector
37 accumulation speed of external system 21
38 accumulation speed of mass point 16
39 accumulation speed of mass point 17
40 accumulation speed of spring 14
41 accumulation speed of spring 15
42 instantaneous energy flowing into external system 21
43 instantaneous energy flowing into mass point 16
44 instantaneous energy flowing into mass point 17
45 collision start time of external system 21
46 separation start time of external system 21 and spring 14

The invention claimed is:

1. A method of energy analysis implemented using an energy analysis program executed by a device, the method comprising:
energy analysis of a part represented at least in part by a difference amount accumulation characteristic that controls accumulation of a difference amount based on input of a distribution amount, and a distribution amount accumulation characteristic that controls accumulation of a distribution amount based on input of a difference amount, the energy analysis comprising:
a first step of calculating an accumulation characteristic matrix of a distribution amount and a difference amount and a concatenation matrix representing a connection relationship between the distribution amount accumulation characteristic and the difference amount accumulation characteristic based on a finite element method model result for the part;
a second step of calculating a difference amount-distribution amount mode matrix and an eigenvalue vector based on the accumulation characteristic matrix and the concatenation matrix;
a third step of subjecting an input difference amount-distribution amount vector obtained by importing an output result of a simulator of an external system outside of the part to a mode coordinate transformation by using the difference amount-distribution amount mode matrix, calculating a mode vector response in a time or frequency domain with respect to the input difference amount-distribution amount vector subjected to the mode coordinate transformation, and obtaining an output difference amount-distribution amount vector by subjecting the mode vector response to physical coordinate transformation using the difference amount-distribution amount mode matrix; and
a fourth step of inputting the output difference amount-distribution amount vector to the simulator as part of a loop to determine an energy balance between the external system and the part.

2. The method of energy analysis according to claim 1, wherein a power mode inside the part is specified by using the difference amount-distribution amount mode matrix and the connection matrix.

3. An energy analysis apparatus configured to perform the method of claim 1 using the energy analysis program.

4. The method of energy analysis according to claim 1, wherein determining an energy balance between the external system and the part comprises determining at least one of a speed, an internal force, or an instantaneous energy for at least a portion of the part.

* * * * *